United States Patent
Mase

(10) Patent No.: US 7,845,612 B2
(45) Date of Patent: Dec. 7, 2010

(54) DEVICE STAND

(75) Inventor: Ryoichi Mase, Shibuya (JP)

(73) Assignee: Power Support Co., Ltd., Tokyo (JP)

( * ) Notice: Subject to any disclaimer, the term of this patent is extended or adjusted under 35 U.S.C. 154(b) by 492 days.

(21) Appl. No.: 11/387,668

(22) Filed: Mar. 23, 2006

(65) Prior Publication Data

US 2007/0187569 A1  Aug. 16, 2007

(30) Foreign Application Priority Data

Feb. 13, 2006 (JP) ................. 2006-1748

(51) Int. Cl.
*A47G 1/24* (2006.01)
(52) U.S. Cl. .......... 248/455; 248/205.3; 248/683; 248/121; 248/126; 248/677; 248/460; 248/461; 248/463; 248/688; 248/447; 248/176.1
(58) Field of Classification Search ........... 248/205.3, 248/683, 121, 126, 677, 460, 463, 688, 461, 248/455, 447, 176.1
See application file for complete search history.

(56) References Cited

U.S. PATENT DOCUMENTS

| | | | | |
|---|---|---|---|---|
| 1,177,233 A | * | 3/1916 | Cutler | 248/460 |
| 1,308,010 A | * | 6/1919 | Gibson | 248/460 |
| 1,829,455 A | * | 10/1931 | Riley | 248/460 |
| 2,401,811 A | * | 6/1946 | Atticks | 248/460 |
| 3,165,290 A | * | 1/1965 | Overton et al. | 248/463 |
| 3,360,227 A | * | 12/1967 | Overton et al. | 248/463 |
| 4,044,980 A | * | 8/1977 | Cummins | 248/456 |
| 4,555,084 A | * | 11/1985 | Anderson et al. | 248/460 |
| 4,555,128 A | * | 11/1985 | White et al. | 281/45 |
| 4,618,119 A | * | 10/1986 | Powell | 248/456 |
| 4,886,231 A | * | 12/1989 | Doerksen | 248/455 |
| 5,082,233 A | * | 1/1992 | Ayers et al. | 248/553 |
| 5,366,197 A | * | 11/1994 | Westland | 248/456 |
| 5,620,163 A | * | 4/1997 | Wu | 248/688 |
| 6,003,831 A | * | 12/1999 | Coleman | 248/688 |
| 6,010,158 A | * | 1/2000 | Croteau | 281/33 |
| 6,113,052 A | * | 9/2000 | Gentile et al. | 248/456 |
| 6,293,591 B1 | * | 9/2001 | Pecci | 281/33 |
| 6,971,622 B2 | * | 12/2005 | Ziegler et al. | 248/454 |
| 7,066,664 B1 | * | 6/2006 | Sitoh et al. | 396/428 |
| 7,320,451 B2 | * | 1/2008 | Ogawa | 248/161 |
| 2002/0088918 A1 | * | 7/2002 | Uto et al. | 248/688 |
| 2002/0162935 A1 | * | 11/2002 | Hardy | 248/460 |

* cited by examiner

*Primary Examiner*—J. Allen Shriver, II
*Assistant Examiner*—Nkeisha J Smith
(74) *Attorney, Agent, or Firm*—Apex Juris, pllc; Tracy M Heims

(57) ABSTRACT

This invention is to provide the stand for the electronic device with the capacity to hole the headset in a handy manner. The stand comprises the main body capable of holding cords, the attaching section positioned on the main body for the electronic device to be mounted and secured thereon, stand cover capable of temporary fitting over the main body and having the section for preventing the cords from unraveling, and the connecting section which joints the main body and the stand cover and allows the stand cover to spread apart from the main body with the hinge section as the fulcrum.

3 Claims, 5 Drawing Sheets

US 7,845,612 B2

DEVICE STAND

BACKGROUND OF THE INVENTION

1. Field of the Invention

This invention relates a stand for a various devices, more particularly a stand for electronic devices with a headset cord receiver.

2. Description of the Related Arts

Conventionally, a stand for the electronic device and a cord receiving equipment are two independent units and are separately sold in the market. A typical conventional stand comprised of two flat panels pivotally connected and hinged at one end lines thereof. When a consumer uses the stand, the other end lines thereof spread apart from each other with one end lines thereof as a fulcrum, and the other end lines which are opened to sit on a table to make a triangle side view. An example of modifications to the conventional stand described above is U.S. Pat. No. 4,044,980. Generally, an adhesive material is applied on one surface of one of the flat panel on which the electronic device is placed and affixed. As in U.S. Pat. No. 6,370,401 B1, a headset receiver generally is a winding device that winds the cords of the headset therearound to compactly store the headset therein.

Although the stand itself can be attached to the device, which can be carried together, many user still carries the headset receiver separately. Here, the user is forced to carry two items. A purpose of carrying the electronic device is because it is handy and light weighted so that the user can carry the device without bothersome preparation. Therefore, there is no useful stand with a capacity of compactly holding the headset in a handy manner.

SUMMARY OF THE INVENTION

An object of this invention is to provide the stand for the electronic device with the capacity to hole the headset in a handy manner. This device should conveniently hold the electronic device in an easily viewable angle and also is capable of holding the headset cord in a handy manner while transporting the electronic device.

To achieve this purpose, this invention provides the stand for the electronic device with the capacity to hold the headset, comprising a main body capable of holding cords, an attaching section positioned on the main body for an electronic device to be mounted and secured thereon, a stand cover capable of temporary fitting over the main body and having a section for preventing the cords from unraveling, and a connecting section which joints the main body and the stand cover and allows the stand cover to spread apart from the main body with the hinge section as the fulcrum.

The main body and/or the stand cover can have a protuberance to prevent the cords from unraveling. The main body can have a hooking section to temporary catch the stand cover while the stand cover is over the main body. In addition, the attaching section can be made of adhesive material and can be separately provided from the main body.

As complying with the structure described in detail below, the headset cords can be conveniently wound around the electronic device to adjust a length of the headset cables and securely held thereat around a desirable position, and at the same time the electronic device sits on a slope of the stand with a desirable angle to provide the best screen view of the device. No complex and bulky structure for winding or retracting the cords of the headset is necessary, thereby lightening the device with the winding or retracting component.

The present invention also provides a preventive measure for tangling of cords and also for having lengthily cords.

BRIEF DESCRIPTION OF THE DRAWINGS

The above and other objects of the present invention will become readily apparent by reference to the following detailed description when considered in conjunction with the accompanying drawings wherein.

DETAILED DESCRIPTION OF THE PREFERRED EMBODIMENTS

Next, a preferred embodiment of this invention will be explained with reference to the accompanied drawings.

Figure 1:
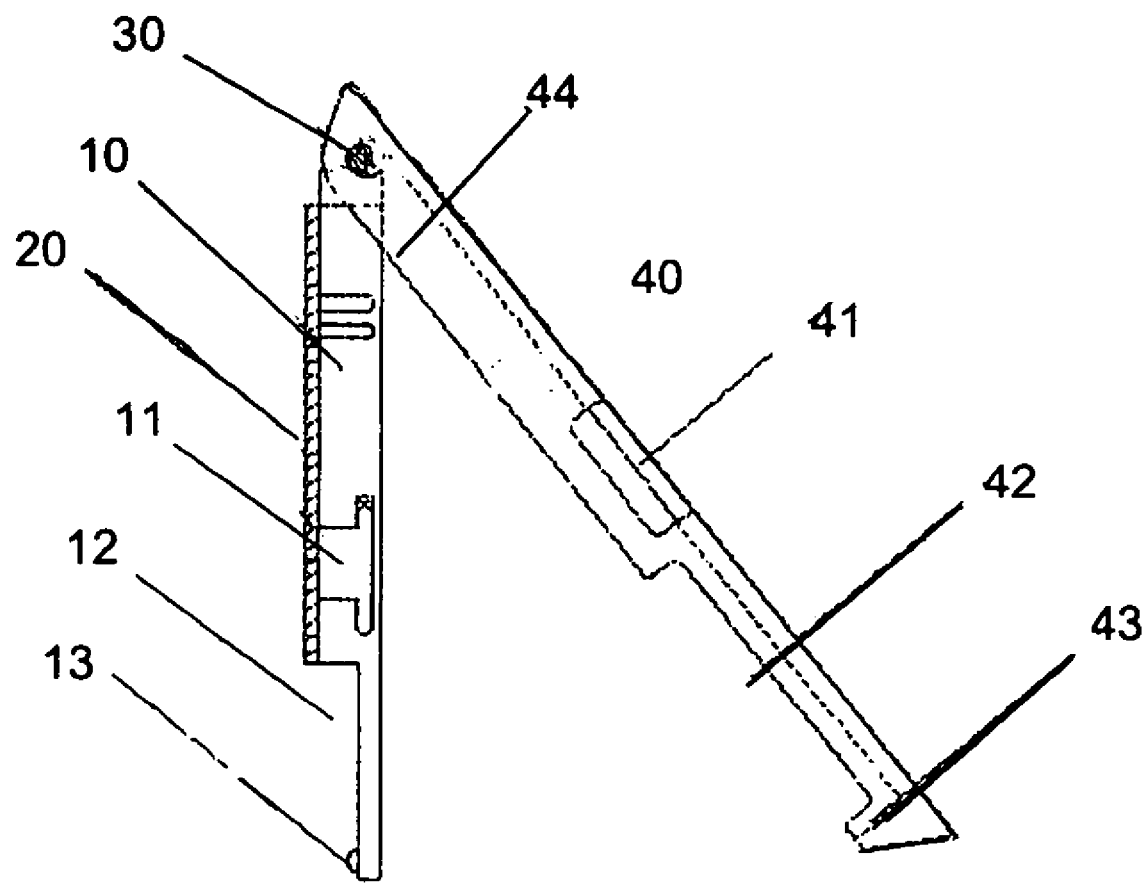
FIG. 1 is a side view of the electronic device stand of the present invention.

The embodiment is explained with reference to FIGS. 1-6. FIG. 1 is a side view of the present invention. The electronic device stand 1 mainly comprised of a main body 10, an adhesive section 20, a hinge section 30, and a stand cover 40.

The main body 10 is a shallow rectangular box and is mainly comprised of a hook groove 11, a cord holder 12, and a cord holding protuberance 13. The hook groove 11 is located at an intermediate portion of the man body 10. The cord holder 12 is located below the hook groove 11. The cord holding protuberance 13 is located at one end of the main body 10. An adhesive section 20 is provided on a surface of the main body 10 facing the electronic device 50.

The stand cover 40 is a flat panel, the other end thereof is pivotally connected to the other end of the main body 10 via a hinge section 30, so that the stand cover 40 moves apart from the main body 10 when the user tries to stand the electronic device 50 thereon. The stand cover 40 is mainly comprised of a cover hook 41, a cord outlet 42, a cord holding hook 43, and two flange strips 44. The cover hook is located at an intermediate portion of the stand cover 40, which should engage with the hook groove 11 to temporary fix the stand cover 40 on the main body 10 as snapping in the hook groove 11. The cord outlet 42 is located below the cover hook 41 and matches with the cord holder 12 when closing the stand cover 40 to cover thereon. The cord outlet 42 is a groove allowing wound cords 60 to rest therein. The cord holding hook 43 is located at one ed of the stand cover 40 which should engage with the cord holding protuberance 13 to function as a cord holding projection. Two flat flange strips 44 along both sides of the stand cover 40 are extending from both sides of the stand cover 40 toward the main body 10 and the electronic device 50.

Figure 2:
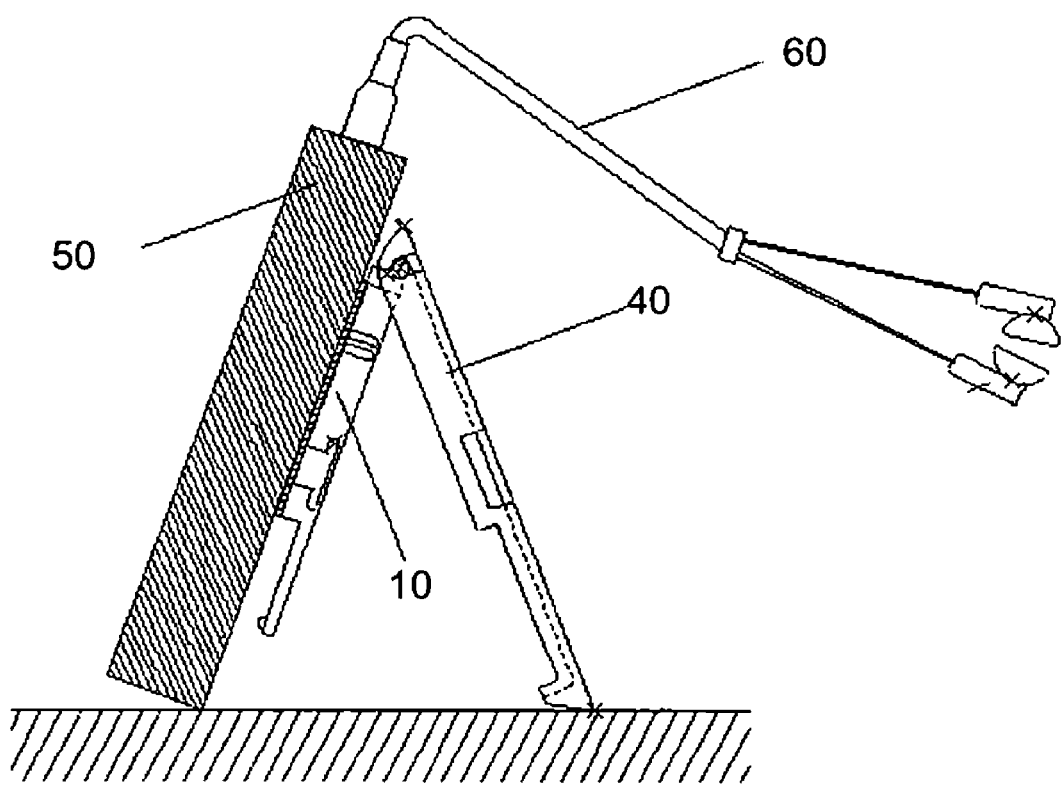
FIG. 2 is a side view of the electronic device stand of the present invention with the electronic device for explaining the operation thereof.
Figure 3:
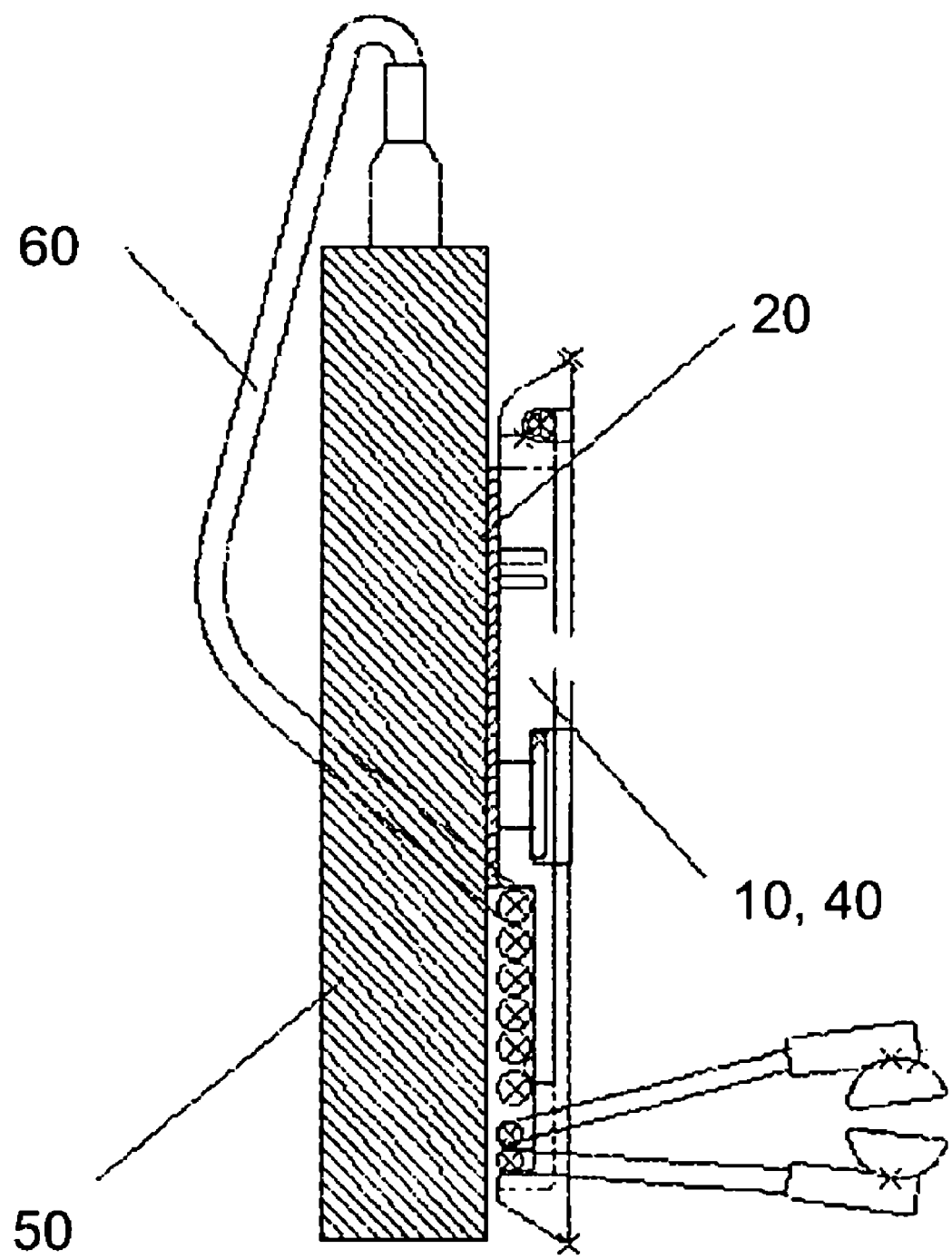
FIG. 3 is a side view of the folded electronic device stand of the present invention with the electronic device.

FIGS. 2-5 are used to explain operation of the present invention. FIG. 3 is a side view of the electronic device stand of the present invention with the electronic device for explaining the operation thereof. The electronic device 50 is first attached to the stand 1 via the adhesive section 20. At that time, the stand cover 40 is opened with the pivot point around the hinge section 30 as the fulcrum. FIG. 2 shows the condition of the stand cover 40 being opened. The cords 60 of the head set is wound around the lower portion of the electronic device 50 which are stored in the cord holder 12 of the main body 10.

FIG. 3 is a side view of the folded electronic device stand of the present invention with the electronic device. When the user needs to carry the electronic device 50 attached to the stand 1, the stand cover 40 needs to be closed as shown in FIG. 3. The cord holding hook 43 of the stand cover 40 holds the cords 60 at the other end of the stand 1 as the stand cover 40 is closed to fit over the main body 10. At that time, the user is able to determine the length of the cords 60 without wound around the electronic device 50.

Figure 4:
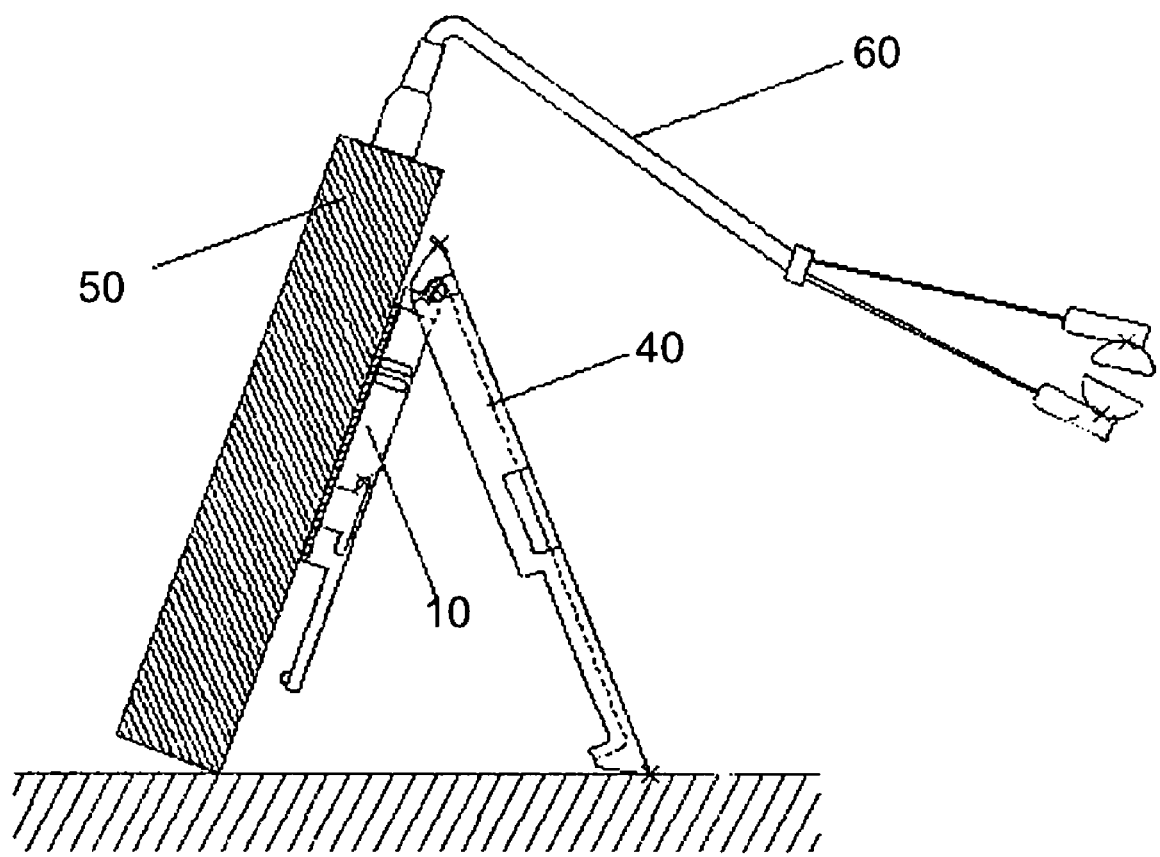
FIG. 4 is a side view of the standing electronic device stand of the present invention with the electronic device.
Figure 5:
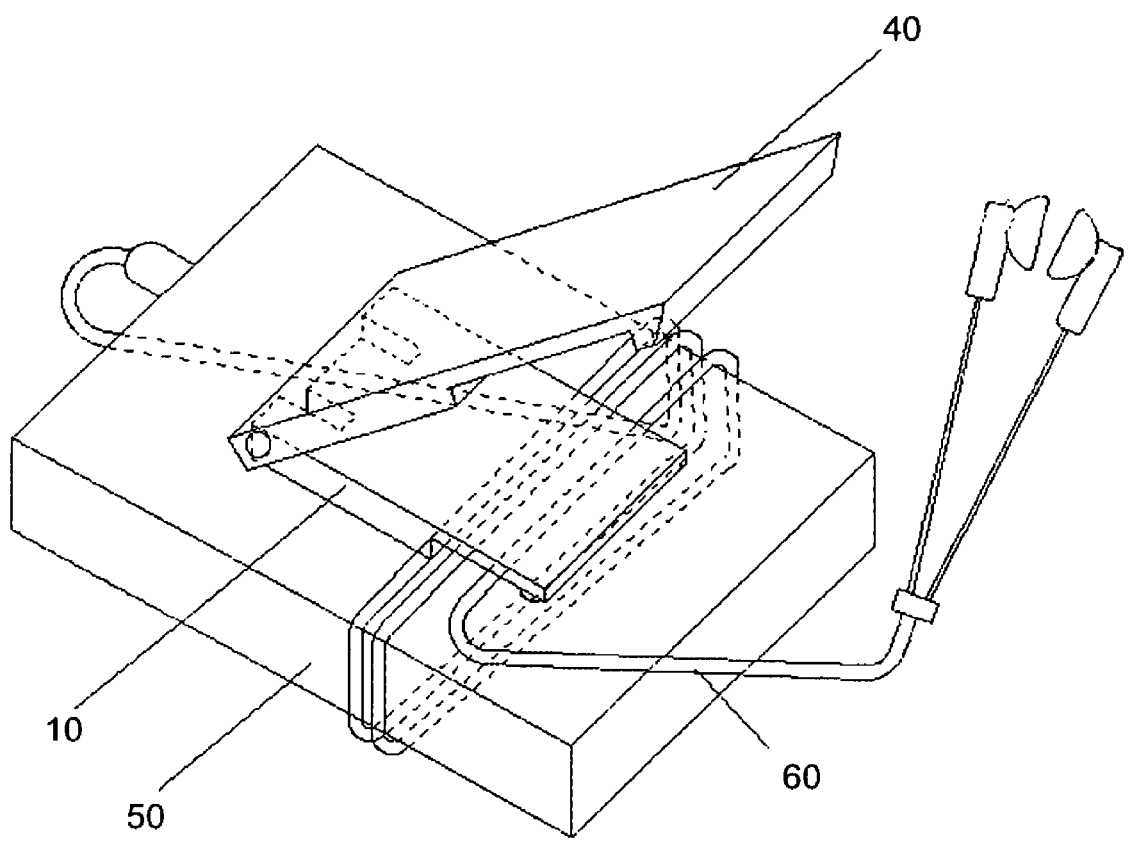
FIG. 5 is a back view of the electronic device stand of the present invention with the headset cords wound therearound.

FIG. 4 is a side view of the standing electronic device stand of the present invention with the electronic device. When the user needs to position the electronic device 50 on the table, the stand cover 40 can be opened as the other end thereof spreading apart from the other end of the main body 10. FIG. 5 is a back view of the electronic device stand of the present invention with the headset cords wound therearound.

It is readily apparent that the above-described embodiments have the advantage of wide commercial utility. It should be understood that the specific form of the invention hereinabove described is intended to be representative only, as certain modifications within the scope of these teachings will be apparent to those skilled in the art. Here, there are may obvious modifications to the embodiment described above. For example, the hinge section 30 can be any conventional hinge mechanism, a pin mechanism, or any other hinging mechanism as long as the main body 10 and the stand cover 40 open and close. The hinge section 30 can also be a restricting hinge which stops and maintains the opening at certain angles. Also, a combination of hook groove 11 and the cover hook 41 can be replaced with many different conventional hooking or holding mechanism as long as the main body 10 and the stand cover 40 can temporary held each other. Furthermore, shapes of each element of the electronic device stand 1 can be determined as necessary. In addition, the adhesive portion can be replaced with any general attaching mechanism as long as the main body 10 and the electronic device 50 can be attached. Finally, it is clear that the storage capacity of electronic device stand 1 is useful for storing things other than headphone cords. Electronic device stand 1 can hold other types of cords and attachments such as adaptors, antennas, auxiliary power supplies, headsets, headphones and microphones. Accordingly, reference should be made to the following claims in determining the full scope of the invention.

What is claimed is:

1. An electronic device stand comprising:
   an electronic device having at least one cord;
   a main body holding said electronic device having at least one cord, said main body comprising:
      an upper end and a lower end;
      an attaching section located on said upper end of said main body with said electronic device mounted and secured thereon;
      a cord holder located on said lower end of said main body having a cord holding protuberance located at a distal portion of said lower end of said main body for securing the cord;
      at least one hook groove located on an intermediate side portion of the main body;
   a stand cover moving from an open position to a closed position and temporarily fitting over and encompassing said main body, the stand cover comprising:
      an upper end and a lower end;
      at least one cover hook located at an intermediate side portion of said stand cover and engaging with said at least one hook groove, thereby temporarily securing said stand cover to said main body in said closed position;
      a cord outlet groove located below said cover hook and near said lower end of said stand cover, said cord outlet groove engaging with said cord holder when said stand cover is in said closed position to allow the cord to rest within said cord holder;
      a cord holding hook located at a distal portion of said lower end of said stand cover that engages with said cord holding protuberance; and
      a fulcrum located at said upper end of said stand cover positioned between said upper end of said main body and said upper end of said stand cover, that allows said lower end of said stand cover to spread apart from said lower end of said main body thus providing said open position and whereby said fulcrum also allows said stand cover to rotate into said closed position such that said stand cover engages with said main body, covers said cord holding protuberance and secures said at least one cord therein.

2. The device stand according to claim 1, wherein said attaching section is comprised of an adhesive material.

3. The device stand according to claim 1, wherein said attaching section is removable from the main body.

\* \* \* \* \*